(12) United States Patent
Cetin et al.

(10) Patent No.: US 7,297,448 B2
(45) Date of Patent: Nov. 20, 2007

(54) DATA STORAGE MEDIUM COMPRISING COLLOIDAL METAL AND PREPARATION PROCESS THEREOF

(75) Inventors: Erdem A. Cetin, Bridgewater, MA (US); Richard T. Ingwall, Newton, MA (US); Richard A. Minns, Arlington, MA (US); David A. Waldman, Concord, MA (US); Larry C. Takiff, Arlington, MA (US)

(73) Assignee: Aprilis, Inc., Maynard, MA (US)

( * ) Notice: Subject to any disclaimer, the term of this patent is extended or adjusted under 35 U.S.C. 154(b) by 0 days.

(21) Appl. No.: 10/300,700

(22) Filed: Nov. 20, 2002

(65) Prior Publication Data

US 2003/0152842 A1 Aug. 14, 2003

Related U.S. Application Data

(63) Continuation of application No. PCT/US01/16635, filed on May 23, 2001.

(60) Provisional application No. 60/206,370, filed on May 23, 2000.

(51) Int. Cl.
*G03H 1/04* (2006.01)
(52) U.S. Cl. ............................ 430/1; 430/2; 430/200.1; 359/3
(58) Field of Classification Search .................... 430/1, 430/2, 200.1; 359/3; 522/25, 28, 29
See application file for complete search history.

(56) References Cited

U.S. PATENT DOCUMENTS

| | | | |
|---|---|---|---|
| 3,779,758 A * | 12/1973 | Polichette | 430/315 |
| 4,701,218 A * | 10/1987 | Barker et al. | 106/1.14 |
| 5,273,857 A * | 12/1993 | Neumann et al. | 430/200 |
| 5,312,969 A * | 5/1994 | Huser et al. | 560/204 |
| 5,759,721 A | 6/1998 | Dhal et al. | |
| 6,030,553 A * | 2/2000 | Huang et al. | 252/520.3 |
| 6,030,708 A * | 2/2000 | Ishibashi et al. | 428/441 |
| 6,212,148 B1 | 4/2001 | Hesselink et al. | |
| 6,399,270 B1 * | 6/2002 | Mori et al. | 430/270.1 |
| 6,441,945 B1 * | 8/2002 | Atwater et al. | 359/296 |
| 6,512,606 B1 * | 1/2003 | Lipson et al. | 359/3 |
| 6,524,771 B2 * | 2/2003 | Maeda et al. | 430/290 |
| 2002/0025991 A1 * | 2/2002 | Crivello | 522/25 |
| 2007/0106012 A1 * | 5/2007 | Matyjaszewski et al. | 524/555 |

FOREIGN PATENT DOCUMENTS

| | | | |
|---|---|---|---|
| DE | 198 21 968 A1 | | 11/1999 |
| JP | 58-098289 | * | 6/1983 |
| JP | 59-033191 | * | 2/1984 |
| JP | 62-061630 | * | 3/1987 |
| JP | 62-063603 | * | 3/1987 |
| WO | WO 99/26112 | | 5/1999 |
| WO | WO 01/09884 A1 | | 2/2001 |

OTHER PUBLICATIONS

Translation of JP 58-098289.*
Translation of JP 59-033191.*
Crivello et al. 'Novel platinum-containing initiators for ring opening polymerization', J. Polymer Sci., vol. 29 pp. 1853-1863 (1991).*
Frens et al., "Cary Lea's Cooloidal silver" Z. Koll., vol. 233, pp. 922-929 (1969).*
Tano et al. "Preparation of organopalladium sols by thermal decompsition of palladium acetate", J. Coll. Interface. Sci., vol. 133(2), p. 530-533 (1989).*
Wang et al., "Synthesis of monodisperse Pt nanocubes . . . ", JACS Commun. (2007) 2 pages.*
Xie et al., "Seedless, surfactantless, high yield synthesis . . . ", Chem,. Mater. (2007) 8 pages.*
Eichler, H. J., et al., "High-Density Disk Storage by Multiplexed Microholograms," *IEEE Journal of Selected Topics in Quantum Electronics*, 4(5): 840-848 (Sep./Oct. 1998).
Esumi, K., et al., "Preparation and Characterization of Bimetallic Pd-Cu Colloids by Thermal Decomposition of Their Acetate Compounds in Organic Solvents," *Chem. Mater.*, 2(5):564-567 (1990).
Tano, T., et al., "Preparation of Organopalladium Sols by Thermal Decomposition of Palladium Acetate," *J. of Colloid and Interface Science*, 133(2): 530-533 (Dec. 1989).
Esumi, K., et al., "Preparation of Organopalladium Particles From Thermal Decomposition of Its Organic Complex in Organic Solvents," *Langmuir*, 5(1): 268-270 (1989).

* cited by examiner

*Primary Examiner*—Martin Angebranndt
(74) *Attorney, Agent, or Firm*—Hamilton, Brook, Smith & Reynolds, P.C.

(57) ABSTRACT

Disclosed is a photopolymerizable holographic recording medium for data storage that comprises colloidal metal, and which exhibits a threshold for a second stage polymerization which is substantially insensitive to the light used for both forming holograms and interrogating the medium during servo and/or read events. Also disclosed is a method of preparing said photopolymerizable holographic recording medium. Also disclosed is a method for preparing a colloidal without additives in a viscous medium.

30 Claims, No Drawings

DATA STORAGE MEDIUM COMPRISING COLLOIDAL METAL AND PREPARATION PROCESS THEREOF

RELATED APPLICATION(S)

This application is a continuation of International Application No. PCT/US01/16635, which designated the United States and was filed on May 23, 2001, published in English, which claims the benefit of U.S. Provisional Application No. 60/206,370, filed on May 23, 2000. The entire teachings of the above applications are incorporated herein by reference.

FIELD OF THE INVENTION

This invention relates to a holographic recording medium in which the underlying molecular structure formed in a format hologram can be altered as microlocalized regions in the format hologram, during a subsequent recording step which uses focused actinic radiation, and which exhibits a threshold for recording that consequently provides the ability to change the refractive index modulation of the original hologram solely in the altered region, and to a process for preparing a recording medium that exhibits the necessary threshold and holographic recording characteristics.

BACKGROUND OF THE INVENTION

In prior art processes for formation of volume-phase holograms, data is stored as holograms resulting from the interference of signal and reference beams within a holographic recording medium comprising a homogenous mixture of at least one polymerizable monomer or oligomer and a polymeric binder; the polymerizable monomer or oligomer must of course be sensitive or sensitized to the radiation used to form the interference fringes. In the illuminated regions of the interference pattern, the monomer or oligomer undergoes polymerization to form a polymer that has a refractive index different from that of the binder. Diffusion of the monomer or oligomer into the illuminated regions, with consequent chemical segregation of binder from these areas and its concentration in the non-illuminated regions, produces spatial separation between the polymer formed from the monomer or oligomer and the binder, thereby providing the refractive index modulation needed to form a hologram. Typically, after the holographic exposure, a post-imaging blanket exposure of the medium to actinic radiation is required to complete the polymerization of the monomer or oligomer and fix the hologram. When holograms are multiplexed co-locationally, such as by multiple holographic exposures at different angle conditions, a post-imaging blanket exposure of the medium to actinic radiation may also be required to complete the polymerization of the monomer or oligomer and fix the multiplexed holograms.

One important potential use of volume holograms is in digital data storage; the three dimensional nature of a volume hologram, which refers to the storage of each bit as a hologram extending throughout the entire volume of the recording medium, renders volume holograms suitable for use in high capacity digital data storage. A group of bits can be encoded and decoded together as a two dimensional array of bits referred to as a page. Various multiplexing methods, such as angular, spatioangular, shift, wavelength, phase-code, and related methods, are used to store multiple pages co-locationally within the same volume or in partially overlapping volumes.

Microholograms, or bit-wise volume holograms, can be recorded independently in layers, such that each layer comprises a 2-dimensional array of bit-wise locations and the number of layers in the depth direction is related to the thickness of a layer relative to the overall thickness of the recording medium. Eichler et al. in IEEE, 4, 5, 840 (1998) describe a method for recording microscopic Bragg-reflectors, with a radius of 1.8 µm and 12 µm depth, in Dupont Omnidex HRF-800 photopolymer films with 20 micron thickness using lenses of a DVD pickup. The number of layers was limited to two by the thickness of the photopolymer recording medium and the beam waist used. In the z direction, or parallel to the counterpropagating direction of the writing beams, there is a periodic modulation with a strongly profiled envelope of the grating fringes, whereas in the orthogonal directions, x and y, the microholograms are characterized by a Gaussian refractive index modulation. Use of this method, however, for recording many such layers in thicker currently available photosensitized photopolymer recording media requires knowledge of the recording sensitivity of a region in the desired layer at the time of recording a particular microhologram, as the local recording sensitivity is affected by recording of previous microholograms in nearby regions of other layers and even by reading of data stored as holograms. A disk containing 10 or more such layers would be an attractive alternative to multilayer CD and/or DVD technology, as the density of data per layer would be similar to that obtained with CD and/or DVD disks and the overall area data density would scale linearly with thickness or number of layers. Strickler et al. in U.S. Pat. No. 5,289,407 describe a non-holographic, multi-layered, refractive index-perturbation optical storage system. Bits are stored at the high intensity focus of a single laser beam as localized perturbations in the index of refraction of a photopolymer.

Photopolymerizable holographic recording media for write-once-read-many (WORM) applications should ideally exhibit lengthy pre-recording shelf life and good recording sensitivity. This particular performance characteristic, however, remains as one of the most difficult to achieve for photopolymerizable holographic recording media that are designed for data storage applications. Typically initiator species form over time, as a result of thermal decomposition processes that take place at room temperature, and thus unintended polymerization occurs. A consequence of short prerecording shelf life is a monotonic and significant decline in recording sensitivity as exhibited by photopolymerizable recording media. The use of conventional photopolymerizable recording media for data storage therefore requires continual knowledge of recording sensitivity as a function of pre-recording time. Moreover, sensitivity may be different for one location on a disk versus another depending upon whether nearby locations were imaged at earlier times, and to what degree polymerization reactions persisted into the surrounding regions. Additionally, if recording has been carried out at a particular location, but in a way such that the entire recording ability of the material at that location has not been fully realized, then subsequent recording of data could be effected at this location by use of various multiplexing methods. This, of course, is only practical when the recording sensitivity is known at the onset of each recording event. The sensitivity in such cases depends on both the time of storage of the material and the shelf life characteristics of the material, as well as upon the extent of photopolymerization that has taken place during previous recording events at a location.

A photopolymerizable holographic recording medium comprising an initiator that creates the requirement of a threshold event for initiation of additional polymerization would be an attractive candidate for WORM data recording applications. The term "threshold" is used herein to refer to a nonlinear relationship between the intensity or energy delivered to the data storage medium and the number of initiated polymerization events that occur. The polymerization process that takes place subsequent to and as a result of the threshold event amplifies the effect of the threshold initiation process. A threshold event for recording of data is a particularly attractive performance characteristic when this event results in local variation of the refractive index modulation in a controlled manner, and if the energy requirements for the event are reasonable in comparison to intensities available from common laser sources. For example, in the case of microscopic Bragg-reflectors, known as microholograms [see for example Eichler et al. in SPIE Vol. 3109, 239 (1997) and in IEEE, 4, 5, 840 (1998)], the term local would refer to the focal region of light transmitted through an imaging lens, and which is defined by a certain radius and depth in the material. A localized non-holographic alteration of the index of refraction, such as by polymerization within the focal region of an imaging lens, alters the refractive index modulation of a hologram that exists in the same region. Hesselink et al. in PCT application WO 99/39248 describe a multi-depth, bit-wise optical data storage system whereby a format hologram is first stored in a holographic storage medium, and data are then stored as selective, microlocalized alterations of the format hologram.

SUMMARY OF THE INVENTION

In one embodiment, the present invention is a photopolymerizable holographic recording medium for data storage that comprises colloidal metal, and which exhibits a threshold for a second stage polymerization which is insensitive to the exposure conditions used for both forming holograms and interrogating the medium during servo and/or read events. In another embodiment, the present invention is also a method of preparing the holographic recording medium. Disclosed herein is the preparation of colloidal metal in the form of a nanoparticle suspension, as a component of a polymerizable holographic recording medium that is responsible for creating the necessary threshold property. Actinic radiation, which is not required to be coherent, initiates polymerization in this medium at locations of independent nanoparticles, such as in the focus of a single laser beam, by the process of absorbance and the concomitant heat generation local to a nanoparticle, provided that the change in temperature in the localized region is high enough and its time duration is sufficiently long. When the temperature near an absorbing nanoparticle reaches a certain value, the necessary value being dependent upon the initiator molecule and its environment, then in a preferred embodiment acid molecules are generated which cause polymerization, such as by the mechanism of cationic ring opening chemistry. Perturbation of the localized structure, and consequently the local diffraction efficiency of a previously recorded hologram, is thus effected by a process which requires a temperature threshold for creation of initiator species which subsequently initiate localized oligomerization and/or polymerization.

The present invention is also a composition comprising stable transition metal colloidal nanoparticles suspended (or dispersed) in a solution having a viscosity greater than about 10 centipoises, preferably greater than about 50 centipoises, more preferably greater than about 100 centipoises and even more preferably greater than about 175 centipoises. The solution typically comprises a monomer or oligomer that polymerizes under cationic conditions or a "binder" that supports cationic polymerization. Alternatively, the solution is a mixture comprising both the monomer (or oligomer) and the binder. The binder is described in greater detail below. The transition metal colloid formed in these solutions typically has sufficiently small dimensions such that attenuation of the intensity of light of visible wavelengths occurs as such light enters into the solution, but that scattering of visible light, such as collimated light from visible laser sources, is substantially absent (generally a diameter less than about 100 nanometers, preferably less than about 50 nanometers, more preferably less than 20 nanometers and even more preferably less than about 10 nanometers). The solution is essentially free of additives that are typically used for formation of transition metal colloidal nanoparticles, such as surfactants, oil microemulsions, nonpolar water-soluble polymers or amphiphilic block or graft copolymers (e.g., greater than 95% free (w/w), preferably greater than 99% free (w/w), more preferably greater than 99.9% free (w/w) and even more preferably 100% free. Optionally, other types of additives, that, for example, can act as stabilizers to specifically prevent or inhibit undesirable premature reaction of the monomer and/or oligomer, can be added to the solution before formation of the transition metal colloid or subsequent to its formation. Such additives can, by way of example, be anti-reducing agents and/or antioxidants. Examples include Irganox 1035, Irganox® 1330, Irganox® 1010, Irganox® 1076, Irganox® D225, Tinuvin 328, Tinuvin® 1130, all available from Ciba-Geigy Corporation of Tarrytown, N.Y.

In yet another embodiment, the present invention is a method of preparing the composition comprising the stable transition metal colloidal nanoparticle suspension (or dispersion). The method comprises the step of thermally decomposing an organotransition metal compound in a solution having a viscosity greater than about 10 centipoises, preferably greater than about 50 centipoises, more preferably greater than about 100 centipoises and even more preferably greater than about 175 centipoises. The method can be carried out without volatile solvents and additives that are typically used for formation of transition metal colloidal nanoparticles.

DETAILED DESCRIPTION OF THE INVENTION

In the prior art, preparation of metal colloids has typically been carried out in aqueous solution in the presence of additives such as surfactants, oil microemulsions, nonpolar water-soluble polymers or amphiphilic block or graft copolymers. In addition, preparation of palladium (0) sols with particle diameter ranges between 7 nm and 260 nm has been carried out by thermal decomposition of organopalladium compounds in various organic solvents using refluxing conditions without any additives. This was accomplished by dissolving organopalladium compounds, such as bis(2,4-pentanedionate) palladium (II) [Pd(acac)$_2$] or palladium acetate, in various organic solvents and refluxing the solutions at their boiling point for a period of minutes to several hours. See for example Esumi et al. in Langmuir, 5, 1, 268 (1989) and Tano et al. in J. Colloid Interface Sci., 133, 2, 530 (1989). Stable and relatively monodisperse palladium (0) sols, with particle diameter ranges between 8 nm and 10 nm were only obtained from [Pd(acac)$_2$] in the organic solvent methyl isobutyl ketone which exhibits a high dipole moment of D~2.7 and a relatively low boiling point of 115.9° C. Bimetallic Pd—Cu colloids, Pd—Cu$_2$O, such as from mixed palladium acetate and copper (II) acetate have similarly been prepared by thermal decomposition in various organic solvents without any additives. See, for example, Esumi et al in Chem. Mater., 2, 5, 564, (1990). The average diameters of the Pd—Cu$_2$O sols ranged between 50 and 130 nm with a decrease of the molar ratio of palladium acetate in the mixed acetates. The prior art of Esumi et al. and Tano et al. describe a critical thermal decomposition temperature for formation of stable metal colloids that ranges between 110° C. and 116° C. in organic solvents of low viscosity, i.e., significantly less than 10 centipoises.

In the present invention preparation of stable transition metal colloids in a holographic recording medium is effected without additives (e.g., additives such as surfactants, oil microemulsions, nonpolar water-soluble polymers or amphiphilic block or graft copolymers) by the method of thermal decomposition in a mixture comprising a binder capable of supporting cationic polymerization or epoxide monomers capable of undergoing cationic polymerization or both. In many cases, the solution will have a viscosity greater about 100 centipoises, and often greater than about 175 centipoises. The solution can comprise a wide range of compositional ratios, preferably ranging from about 90 parts binder and 10 parts monomer or oligomer (w/w) to about 10 parts binder and 90 parts monomer or oligomer (w/w). A holographic recording medium, suitable for preparing a hologram by the method of cationic polymerization initiated by the acid produced from the acid generator (see U.S. Pat. No. 5,759,721), can be formed by subsequently introducing into the mixture comprising a stable metal colloid an acid generator which produces an acid upon exposure to actinic radiation, and various sensitizers that sensitize the acid generator to various wavelengths of actinic radiation and that are preferably photobleachable so that the visible absorption of the holographic medium decreases during exposure, the holographic medium being essentially free from materials capable of undergoing free radical polymerization. The medium can additionally exhibit secondary polymerization, which causes localized perturbations in the index of refraction of the photopolymer, by also introducing into the said medium a thermal acid generator that produces an acid solely upon exposure to adequate temperature. The acid generator, which in the presence of a sensitizer produces an acid upon exposure to actinic radiation, may also be used as a thermal acid generator when photobleaching of remaining sensitizer is complete.

Preferred transition metal colloids can be prepared in the aforementioned binders, monomers or mixtures of binder and monomer without additives by thermal decomposition of transition metal compounds. In one aspect, suitable transition metal compounds include transition organometal compounds which can be thermally reduced to zero oxidation state and which, when reduced, absorb substantially uniformly over the visible spectrum. Examples include palladium (II) and platinum (II) compounds such as bis(2,4-pentanedionate) palladium (II) and bis(2,4-pentanedionate) platinum (II) to form palladium (0) and platinum (0) nanoparticles, respectively. In another aspect, suitable organometal compounds include those which can be thermally reduced and which, when reduced, absorb over narrow ranges of the visible spectrum. Examples of such colloidal nanoparticles include, but are not limited to, gold, silver, nickel, cobalt, and copper.

Preferred monomers for use in the present invention are siloxanes which are compounds that are generally stable on prolonged storage but capable of undergoing rapid cationic polymerization. The preferred type of epoxy group is a cycloalkene oxide group, especially a cyclohexene oxide group. Particularly preferred siloxane monomers are difunctional, and are those in which two cyclohexene oxide groupings are linked to an Si—O—Si grouping. These monomers have the advantage of being compatible with the preferred siloxane binders. Preferred difunctional epoxide monomers are those of the formula:

$$RSi(R^1)_2OSi(R^2)_2R \qquad (I)$$

where each group R is, independently, a monovalent epoxy functional group having 2-10 carbon atoms; each group $R^1$ is a monovalent substituted or unsubstituted $C_{1-12}$ alkyl, $C_{1-12}$ cycloalkyl, aralkyl or aryl group; and each group $R^2$ is, independently, $R^1$, or a monovalent substituted or unsubstituted $C_{1-12}$ alkyl, $C_{1-12}$ cycloalkyl, aralkyl or aryl group. One specific monomer of this type found useful in the present process is that in which each group R is a 2-(3,4-epoxycyclohexyl)ethyl grouping; each grouping $R^1$ is a methyl group, and each group $R^2$ is a methyl group, and which is available from Polyset Corporation, Inc. Mechanicsville, N.Y., under the tradename PC-1000, and the preparation of this specific compound is described in, inter alia, U.S. Pat. Nos. 5,387,698 and 5,442,026.

A second particularly preferred group of siloxane monomers is polyfunctional, and are those in which three or four cyclohexene oxide groupings are linked through an Si—O group to a central Si group; these monomers have the advantage of being compatible with the preferred siloxane binders and providing for rapid polymerization. The term polyfunctional is used herein in accordance with conventional usage in the chemical arts to mean a material in which each molecule has at least three groups of the specified functionality, in the present case at least three epoxy groups. Preferred polyfunctional epoxide monomers are those of the formula $$R^3Si(OSi(R^4)_2R^5)_3 \qquad (II)$$

where $R^3$ is an $OSi(R^4)_2R^5$ grouping, or a monovalent substituted or unsubstituted $C_{1-12}$ alkyl, $C_{1-12}$ cycloalkyl, aralkyl or aryl group; each group $R^4$ is, independently, a monovalent substituted or unsubstituted $C_{1-12}$ alkyl, $C_{1-12}$ cycloalkyl, aralkyl or aryl group; and each $R^5$ is, independently, a monovalent epoxy functional group having 2-10 carbon atoms. The preparation of these monomers is described in, inter alia, U.S. Pat. Nos. 5,169,962; 5,260,399; 5,387,698; and 5,442,026. One specific monomer of this type found useful in the present process is that in which $R^3$ is a methyl group or an $OSi(R^4)_2R^5$ grouping; each group $R^4$ is a methyl group, and each group $R^5$ is a 2-(3,4-epoxycyclohexyl)ethyl grouping.

Optionally, the holographic recording medium additionally comprises a third monomer which undergoes cationic polymerization. In one example, the third monomer is a vinyl ether comprising one or more alkenyl ether groupings or a propenyl ether comprising one or more propenyl ether groupings.

The binder used in the process and preparation of the present medium comprising transition metal colloids should, of course, be chosen such that it does not inhibit cationic polymerization of the monomers used (e.g., "supports" cationic polymerization), such that it is miscible with the monomers used and such that its refractive index is significantly different from that of the polymerized monomer or oligomer (e.g., the refractive index of the binder differs from the refractive index of the polymerized monomer by at least 0.04 and preferably at least 0.09). Binders can be inert to the polymerization processes described herein or optionally can polymerize during one or more of the polymerization events. Preferred binders for use in the current process are polysiloxanes, due in part to availability of a wide variety of polysiloxanes and the well documented properties of these oligomers and polymers. The physical, optical, and chemical properties of the polysiloxane binder can all be adjusted for both optimum performance in the recording medium as well as optimum solvation and stabilization of transition metal colloids. The efficiency of the holograms produced by the present process in the present medium is markedly dependent upon the particular binder employed. Although those skilled in the holographic art will have no difficulty in selecting an appropriate binder by routine empirical tests, in general poly(methyl phenyl siloxanes) and oligomers thereof, such as 1,3,5-trimethyl-1,1,3,5,5-pentaphenyltrisiloxane, a trimer, sold by DowCorning under the trademark DowCorning® 705, have been found to give efficient holograms. Furthermore, despite having a high boiling point, 225° C. at 0.5 mm Hg, they have been found to provide a suitable electrostatic environment, at temperatures substantially below the boiling point of the binder, for solvation of the transition metal compounds and stabilization of the resulting transition metal colloids at relatively high concentrations.

The first acid generator used in the present recording medium produces an acid upon exposure to the actinic radiation. The term "first acid generator" or PAG is used herein to refer to the component or components of the medium that are responsible for the radiation-induced formation of acid. Thus, the first acid generator may comprise only a single compound that produces acid directly. Alternatively, the first acid generator may comprise an acid generating component which generates acid and one or more sensitizers which render the acid generating component sensitive to a particular wavelength of actinic radiation, as discussed in more detail below. The acid produced from the first acid generator may be either a Bronsted acid or Lewis acid, provided of course that the acid is of a type and strength which will induce cationic polymerization of the monomer. When the acid produces a Bronsted acid, this acid preferably has a $PK_a$ less than about 0. Known superacid precursors such as diazonium, sulfonium, phosphonium and iodonium salts may be used in the present medium, but iodonium salts are generally preferred. Diaryliodonium salts have been found to perform well in the present media, with specific preferred diaryliodonium salts being (5-octyloxyphenyl)phenyliodonium hexafluoroantimonate and ditolyliodonium tetrakis(pentafluorophenyl)borate.

In the absence of any sensitizer, iodonium salts are typically only sensitive to radiation in the far ultra-violet region, below about 300 nm, and the use of far ultra-violet radiation is inconvenient for the production of holograms because for a given level of performance ultra-violet lasers are substantially more expensive than visible lasers. It is well known, however, that by the addition of various sensitizers, iodonium salts can be made sensitive to various wavelengths of actinic radiation to which the salts are not substantially sensitive in the absence of the sensitizer. In particular, iodonium salts can be sensitized to visible radiation using certain aromatic hydrocarbons substituted with at least one alkynyl groups or one alkenyl groups, preferably at least two alkynyl groups or two alkenyl groups, a specific preferred sensitizer of this type being 5,12-bis(phenylethynyl)naphthacene. This sensitizer renders iodonium salts sensitive to the 514.5 nm radiation from an argon ion laser, and to the 532 nm radiation from a frequency-doubled YAG laser, both of which are convenient sources for the production of holograms.

The second acid generator used in the present recording medium produces an acid solely upon exposure to heat. The term "second acid generator" or TAG is thus used herein to refer to the component or components of the medium that are responsible for the thermal-induced formation of acid. The second acid generator generally comprises only a single compound that produces acid directly. The acid produced from the second acid generator may be either a Bronsted acid or Lewis acid, provided of course that the acid is of a type and strength which will induce cationic polymerization of the monomer. When the acid produces a Bronsted acid, this acid preferably has a $pK_a$ less than about 0. The second acid generator can be the first acid generator, such as when it is present in the medium in amounts in excess of the concentration required for radiation-induced formation of acid. In such cases the sensitizer, which renders the first acid generator sensitive to a particular wavelength, must first undergo a process that provides for complete photobleaching. Known superacid precursors such as diazonium, sulfonium, phosphonium and iodonium salts may be used in the present medium, but sulfonium salts are generally preferred, specifically those which are only thermal acid generators. Benzyldialkyl sulfonium salts have been found to perform well in the present media, with specific preferred benzyldialkylsulfonium salts being (4-vinylbenzyl)tetramethylene sulfonium tetrakis[3,5-bis(trifluoromethyl)phenyl]borate, (4-methylbenzyl)tetra methylenesulfonium tetrakis[3,5-bis (trifluoromethyl)phenyl] borate, and (4-methylbenzyl)tetramethylene sulfonium tetrakis(pentafluorophenyl) borate. Other examples of sulfonium salts include for example dialkylphenacyl sulfonium salts (see *Polymer Journal*, vol. 17, No. 1, pp 73-83, 1985, U.S. Pat. No. 6,031,014), diarylphenacyl sulfonium salts (see U.S. Pat. No. 6,031,014), triarylsulfonium salts (see Polymer Journal, vol. 17, No. 1, pp 73-83, 1985), dialkylaryl sulfonium salts (see U.S. Pat. No. 5,055,376, Adv. Polym. Sci., 62, 1, 1984) diarylalkyl sulfonium salts (see U.S. Pat. No. 5,055,376, Adv. Polym. Sci., 62, 1, 1984), and trialkylsulfonium salts (U.S. Pat. No. 5,084,586), and preferred counterions include $AsF_6^-$, $SbF_6^-$, $PF6^-$, $BF_4^-$ and $(CF_3SO_2)_3C^-$. The entire teachings of these references are incorporated herein by reference.

The following examples are now given, though by way of illustration only, to show details of particularly preferred reagents, conditions, an techniques used in preferred media and processes of the present invention.

EXEMPLIFICATION

Example 1

Bis(2,4-pentanedionate) palladium (II) (Aldrich, 99%) was first added to a mixture of DowCorning® 705 and a difunctional epoxide monomer, PC-1000, and the contents was then stirred at room temperature prior to heating. The mixture was heated slowly to about 80° C. while stirring and held isothermally for about 15 minutes until complete dissolution occurred, at which time the color changed to light yellow. The mixture was then rapidly heated in an oil bath under nitrogen atmosphere while stirring until the color started to change from light yellow to brown, which for example occurs at a bath temperature of about 185° C. for a 50/50 mixture (w/w) of DowCorning® 705 and PC-1000, and upon continued heating the mixture turned a blackish color, which for the aforementioned mixture occurred at about a bath temperature of 200° C. The mixture was subsequently kept at this temperature for about 30 minutes and was then cooled to ambient temperature under nitrogen atmosphere. The resulting blackish colored solution, which contains colloidal Palladium (0) in amounts ranging from 500 to about 8000 ppm, was filtered through a 0.2 micron syringe-fit filter. The filtered solution containing colloidal Palladium (0) was added dropwise to a polyfunctional siloxane monomer with four cyclohexene oxide groupings, while it was being stirred, and which contained 4% by weight of the final recording medium of tetrafunctional ditolyliodonium tetrakis (pentafluorophenyl)borate and 2.5% by weight of the final recording medium of (4-vinylbenzyl) tetramethylenesulfonium tetrakis[3,5-bis(trifluoromethyl)phenyl]borate. To this solution was added the sensitizer, 5,12-bis(phenylethynyl)naphthacene, dissolved in phenylnaphthalene at 0.007% by weight of the final recording medium while stirring.

Unslanted, plane-wave, transmission holograms were recorded in the above media in the conventional manner with two spatially filtered and collimated argon ion laser writing beams at 514.5 nm with equal irradiance levels directed onto the sample with equal semiangles of about 25° about the normal. A beam expanded HeNe probe beam, incident at the appropriate Bragg angle, was used to detect the development of holographic activity during exposure. Real time diffraction intensity data was obtained using two Model 818-SL photodiodes and a dual channel multi-function optical meter Model 2835-C from Newport Corporation. Four plane-wave transmission holograms holograms were multiplexed sequentially and co-locationally using peristrophic angle increments of 10°. The diffraction efficiency attained was about 54%, 60%, 59%, and 5% for exposure energies of about 61, 97, 194, and 194 mJ/cm$^2$, respectively. The cumulative grating strength exhibited by the medium, which comprises a transition metal colloid, is about 2.5 indicating that additional monomer species remain which can be subsequently reacted by a second stage thermal initiated polymerization. Scattering of light was not observed.

Example 2

Bis(2,4-pentanedionate) platinum (II) (Aldrich, 99%) was first added to a mixture of DowCorning® 705 and a difunctional epoxide monomer, PC-1000, and the contents was then stirred at room temperature prior to heating. The mixture was heated slowly to about 85° C. while stirring and held isothermally for about 15 minutes until complete dissolution occurred, at which time the color changed to light yellow. The mixture was then rapidly heated to about 200° C. under nitrogen atmosphere while stirring and held isothermally at about 200° C. until the color started to change from light yellow to brown, which for example occurs after about 90 minutes for a 50/50 mixture (w/w) of DowCorning® 705 and PC-1000. After the solution was held isothermally at about 200° C. for about an additional 45 minutes it turned a blackish color. The mixture was then cooled to ambient temperature under nitrogen atmosphere. The resulting blackish colored solution, which contains colloidal Platinum (0) in amounts ranging from 500 to about 8000 ppm was filtered through a 0.2 micron syringe-fit filter. The filtered solution containing colloidal Platinum (0) was added dropwise to a polyfunctional siloxane monomer with four cyclohexene oxide groupings, while it was being stirred, and which contained 4% by weight of the final recording medium of tetrafunctional ditolyliodonium tetrakis (pentafluorophenyl) borate and 2.5% by weight of the final recording medium of (4-vinylbenzyl) tetramethylenesulfonium tetrakis[3,5-bis(trifluoromethyl)phenyl]borate. To this solution was added the sensitizer, 5,12-bis(phenylethynyl)naphthacene, dissolved in phenylnaphthalene at 0.007% by weight of the final recording medium while stirring.

The medium, such as for Example 1 and 2 above with 7000 ppm colloidal metal, was tested for photoinitiated polymerization followed by a second stage thermal initiated polymerization by use of differential scanning calorimetry. Cationic ring-opening polymerization is an exothermic process and polymerization rates and extents of monomer conversion can, therefore, be determined through calorimetry. Calorimetric analysis was performed on a Perkin-Elmer DSC-7 Differential Scanning Calorimeter equipped with a DPC-7 Photocalorimeter Module. Samples, 2.0-4.0 mg, were irradiated in the calorimeter with the 514.5 nm line from a Spectra-Physics 161C-514 laser at intensities between 5 and 10 mW/cm$^2$, utilizing a multimode (200 μm core) fiber optic cable. The method is described by Waldman et al. in J. Imaging Sci. Technol., 41, 5, 497-514 (1997). The heat flow required to maintain the sample at a constant temperature of 25° C. was recorded at time intervals of about 0.20 seconds. This data was integrated to determine the evolved heat of reaction versus illumination time which, after appropriate normalization, was converted to the extent of reaction versus time. The medium was exposed to an extensive flood exposure of 1500 to 3000 mJ/Cm$^2$ to photobleach all remaining sensitizer prior to raising the temperature to induce thermal polymerization.

The medium was next evaluated to demonstrate that it supports thermal polymerization of unreacted monomer when initiated by thermal decomposition of the TAG. Thermal polymerization, a second stage polymerization, was induced by subsequently raising the temperature of the medium at a rate 10 to 50° C. per minute from 25° C. to 200° C. The onset of heat evolution, associated with thermally induced polymerization arising from initiation with the TAG, occurred at about 86° C. at a heat rate of 50° C. per minute and the peak occurred at about 106° C. The sample weight was about 3.78 mg and thus a thermal lag likely occurred due to the high heating rate and the sample mass used. The relative enthalpy in J/g associated with the heat evolution from photoinitiated polymerization associated with the first acid generator or PAG was less than from thermally induced polymerization associated with the second acid generator or TAG. The temperature at which the thermally induced second stage polymerization occurs is about 50° C. lower than the temperature needed to induce generation of acid by any of the remaining iodonium salt. Scattering of light was not observed.

Example 3

Palladium (II) acetylacetonate (40.7 mg) was dissolved in 2.0 ml of methylene chloride and then 9.02 g of DowCorning® 705 silicone fluid was added into the mixture. The contents of the mixture were kept under nitrogen atmosphere. The mixture was stirred at ambient temperature for 10 minutes prior to heating, followed by slow heating of the mixture to 80° C. while stirring. The mixture was maintained isothermally at 80° C. for about 15 minutes until complete dissolution occurred, at which time the color changed to a dark yellow. Methylene chloride was then removed from the solution by using a nitrogen purge of the solution. The solution was subsequently heated in an oil bath under nitrogen atmosphere while stirring until the color changed from yellow to brown, which occurred at 175-185° C. Heating was continued additionally to higher temperature until the color changed to a darker blackish color, which occurred at about 200° C. The solution was maintained isothermally at 200° C. for about 30 minutes followed by cooling under nitrogen atmosphere to ambient temperature. The resulting black solution which contains colloidal Palladium (0) at about 4500 ppm concentration was filtered through a 0.2 micron syringe-fit filter.

While this invention has been particularly shown and described with references to preferred embodiments thereof, it will be understood by those skilled in the art that various changes in form and details may be made therein without departing from the scope of the invention encompassed by the appended claims.

What is claimed is:

1. A composition comprising:
   1) transition metal colloidal nanoparticles dispersed in a solution having a viscosity greater than about 10 centipoise, wherein the metal nanoparticles have an average diameter of less than 100 nanometers;
   2) at least one monomer or oligomer which undergoes cationic polymerization;
   3) optionally a binder which is capable of supporting cationic polymerization; and
   4) a first acid generator which produces acid upon exposure to actinic radiation wherein the transition metal colloid nanoparticles suspended in the medium generate heat when exposed to actinic radiation.

2. The composition of claim 1 additionally comprising a sensitizer, which sensitizes the first acid generator to produce acid at a particular wavelength of light.

3. The composition of claim 2 wherein the sensitizer is an aromatic hydrocarbon substituted with at least one alkynyl groups or one alkenyl groups.

4. The composition of claim 1 further comprising a second acid generator which produces acid when exposed to heat and wherein the first acid generator and the second acid generator are optionally the same.

5. The composition of claim 4 wherein the second acid generator is a dialkylaryl sulfonium salt, a diarylalkyl sulfonium salt, a dialkylphenacyl sulfonium salt, a diarylphenacyl sulfonium salt, a triarylsulfonium salt or a trialkylsulfonium salt.

6. The composition of claim 4 wherein the first acid generator and second acid generator each produce acid having a pKa less than about 0.

7. The composition of claim 4 wherein the first acid generator is a diaryliodonium salt and the second acid generator is a dialkylaryl sulfonium salt, a diarylalkyl sulfonium salt, a dialkyiphenacyl sulfonium salt, a diarylphenacyl sulfonium salt, a triarylsulfonium salt or a trialkylsulfonium salt.

8. The composition of claim 1 wherein the first acid generator is a diaryliodonium salt.

9. The composition of claim 1 wherein the metal nanoparticles have an average diameter of less than about 20 nanometers.

10. The composition of claim 1 wherein the metal nanoparticles have an average diameter of less than about 10 nanometers.

11. The composition of claim 1 wherein the binder has a refractive index that differs from the refractive index of polymerized monomer or oligomer by at least about 0.04.

12. The composition of claim 11 wherein the monomer is an epoxide monomer.

13. The composition of claim 12 wherein the solution comprises between about 10 parts binder and about 90 parts monomer(w/w) to between about 10 parts monomer and about 90 parts binder (w/w).

14. The composition of claim 13 wherein the binder is a poly(methyl phenyl siloxane) and the epoxide monomer is a siloxane comprising two or more cyclohexene oxide groups.

15. The composition of claim 12 wherein the epoxide monomer is a polyfunctional siloxane comprising three or more cyclohexene oxide groups.

16. The composition of claim 14 wherein the composition additionally comprises a second monomer which polymerizes under cationic conditions.

17. The composition of claim 16 wherein the second monomer is a polyfunctional siloxane comprising three or more cyclohexene oxide groups.

18. The composition of claim 16 wherein the composition additionally comprises a third monomer which polymerizes under cationic conditions.

19. The composition of claim 18 wherein the third monomer is a vinyl ether comprising one or more alkenyl ether groupings.

20. The composition of claim 18 wherein the third monomer is a propenyl ether comprising one or more propenyl ether groupings.

21. The composition of claim 12 wherein the epoxide monomer is $RSi(R^1)_2OSi(R^2)_2R$ or $R^3Si(OSi(R^4)_2R^5)_3$, wherein:
   each group R is, independently, a monovalent epoxy functional group having 2-10 carbon atoms;
   each group $R^1$ is a monovalent substituted or unsubstituted $C_{1-12}$ alkyl, $C_{1-12}$ cycloalkyl, aralkyl or aryl group;
   each group $R^2$ is, independently, $R^1$, or a monovalent substituted or unsubstituted $C_{1-12}$ alkyl, $C_{1-12}$ cycloalkyl, aralkyl or aryl group;
   $R^3$ is an $OSi(R^4)_2R^5$ grouping, or a monovalent substituted or unsubstituted $C_{1-12}$ alkyl, $C_{1-12}$ cycloalkyl, aralkyl or aryl group;
   each group $R_4$ is, independently, a monovalent substituted or unsubstituted $C_{1-12}$ alkyl, $C_{1-12}$ cycloalkyl, aralkyl or aryl group; and
   each $R^5$ is, independently, a monovalent epoxy functional group having 2-10 carbon atoms.

22. The composition of claim 21 wherein the transition metal colloidal nanoparticles are palladium (0) or platinum (0) nanoparticles.

23. The composition of claim 21 wherein the transition metal colloidal nanoparticles are gold, silver, nickel, cobalt or copper.

24. The composition of claim 21 wherein the epoxide monomer is $RSi(R^1)_2OSi(R^2)_2R$ and R is 2-(3,4-epoxycyclohexyl)ethyl; each $R^1$ is a methyl group, and each group $R^2$ is a methyl group; or the epoxide monomer is $R_3Si(OSi(R^4)_2R^5)_3$ and $R^3$ is a methyl group or $OSi(R^4)_2R^5$; each $R^4$ is a methyl group, and each group $R^5$ is 2-(3,4-epoxycyclohexyl)ethyl.

25. The composition of claim 24 wherein the binder is 1,3,5-trimethyl-1,1,3,5,5-pentaphenyltrisiloxane.

26. The composition of claim 1 wherein the binder is a polysiloxane oligomer or polymer.

27. The composition of claim 1 wherein the transition metal colloidal nanoparticles are dispersed in the at least one monomer or oligomer and the binder.

28. The composition of claim 1, wherein transition metal colloidal nanoparticles are dispersed in a solution having a viscosity greater than about 50 centipoise.

29. A holographic recording medium, comprising:
1) at least one monomer or oligomer which undergoes cationic polymerization;
2) a binder which is capable of supporting cationic polymerization;
3) a transition metal colloid suspended in the medium which generates heat when exposed to actinic radiation; and
4) a compound which produces acid when exposed to heat, and wherein the metal colloid particles have an average diameter of less than 100 nanometers.

30. A holographic recording medium comprising:
1) at least one epoxide monomer that is a siloxane;
2) a poly(methyl phenyl siloxane);
3) a Pd(0) or Pt(0) colloid particles having an average diameter of less than 100 nanometers suspended in the medium which generates heat when exposed to actinic radiation;
4) a compound, referred to as a "first acid generator" which produces acid when exposed to actinic radiation;
5) a compound, referred to as a "second acid generator" which produces acid when exposed to heat; and
6) a compound, referred to as a "sensitizer", which sensitizes the first acid generator to produce acid at a particular wavelength of light, and wherein the metal colloid particles have an average diameter of less than 100 nanometers.

* * * * *

UNITED STATES PATENT AND TRADEMARK OFFICE
CERTIFICATE OF CORRECTION

PATENT NO. : 7,297,448 B2
APPLICATION NO. : 10/300700
DATED : November 20, 2007
INVENTOR(S) : Erdem A. Cetin et al.

It is certified that error appears in the above-identified patent and that said Letters Patent is hereby corrected as shown below:

Column 11
Line 57, delete "dialkyiphenacyl" and insert --dialkylphenacyl--

Column 12
Line 60, delete "R3Si(OSi($R^4$)$_2$$R^5$)$_3$" and insert --$R^3$Si(OSi($R^4$)$_2$$R^5$)$_3$--

Signed and Sealed this

Seventeenth Day of June, 2008

JON W. DUDAS
*Director of the United States Patent and Trademark Office*